United States Patent [19]

Matsuura

[11] Patent Number: 4,694,454
[45] Date of Patent: Sep. 15, 1987

[54] DYNAMIC MEMORY DIAGNOSIS AND ERROR CORRECTION APPARATUS

[75] Inventor: Yasuhiko Matsuura, Hadano, Japan

[73] Assignee: Hitachi, Ltd., Tokyo, Japan

[21] Appl. No.: 759,954

[22] Filed: Jul. 29, 1985

[30] Foreign Application Priority Data

Jul. 27, 1984 [JP] Japan .................. 59-155536

[51] Int. Cl.[4] .................................. G11C 7/00
[52] U.S. Cl. .................................. 371/13; 371/38; 365/22
[58] Field of Search ............... 371/13, 21, 38, 18, 371/5; 365/200, 222, 201, 195; 364/200, 900

[56] References Cited

U.S. PATENT DOCUMENTS

| | | | |
|---|---|---|---|
| 4,371,930 | 2/1983 | Kim | 371/13 |
| 4,412,314 | 10/1983 | Proebsting | 371/13 |
| 4,535,455 | 8/1985 | Peterson | 371/38 |
| 4,542,454 | 9/1985 | Brcich | 371/13 |
| 4,593,391 | 6/1986 | Mizushima | 371/13 |
| 4,604,749 | 8/1986 | Shinoda | 371/13 |
| 4,604,751 | 8/1986 | Aichelmann | 371/38 |

Primary Examiner—Michael R. Fleming
Attorney, Agent, or Firm—Antonelli, Terry & Wands

[57] ABSTRACT

In a certain refresh cycle, a certain address is designated as a refresh address, and a read operation for the refresh is conducted. The data thus read out is checked, and, if a correctable error is detected, the corrected data and its address are held in a corrected data register and an address register, respectively. In the succeeding refresh cycles, reading operations for the refresh are conducted for the succeeding addresses. When the same address as that held in the address register is designated again in due time as the refresh address, a writing operation for the refresh is conducted to write back the content of the corrected data register.

7 Claims, 10 Drawing Figures

FIG. 6

| 0 | P0 | M0 | R0 | C0 | RF |
|---|----|----|----|----|----|
| ≑15μs — | | (RANDOM) | | | R/W ↓ R/W |
| 1 | P0 | M0 | R1 | C0 | RF |

| 256 | P0 | M0 | R0 | C1 | RF |
|---|---|---|---|---|---|
| ↓ | ↓ | ↓ | ↓ | ↓ | ↓ |
| n | P0 | M0 | Rn | C1 | RF |
| ↓ | ↓ | ↓ | ↓ | ↓ | ↓ |
| 511 | P0 | M0 | R255 | C1 | RF |
| 256' | P0 | M0 | R0 | C1 | RF |
| | | | | | RF |
| n' | P0 | M0 | Rn | C1 | (WF) |
| | | | | | RF |
| 511' | P0 | M0 | R255 | C1 | RF |
| 256" | P0 | M0 | R0 | C1 | RF |
| ↓ | ↓ | ↓ | ↓ | ↓ | ↓ |
| n-1" | P0 | M0 | Rn-1 | C1 | RF |

| n" | P0 | M0 | Rn | C1 | (RF) |
|---|---|---|---|---|---|
| ↓ | ↓ | ↓ | ↓ | ↓ | ↓ |
| 511" | P0 | M0 | R255 | C1 | RF |
| 512 | P0 | M0 | R0 | (C2) | RF |

DYNAMIC MEMORY DIAGNOSIS AND ERROR CORRECTION APPARATUS

BACKGROUND OF THE INVENTION

The present invention relates to a dynamic memory and, more particularly, to an apparatus for conducting error diagnosis and correction of a dynamic memory simultaneously with refresh operations.

Since, in a dynamic memory, stored data is lost with the lapse of time, it is necessary to repeat the read-out and write-back of the stored data at suitable intervals, and such an operation is called "refresh". In an MOS dynamic memory, for example, memory cells are essentially capacitors so that the data bits are stored in the form of charges in the capacitors and are gradually lost by a variety of leakage currents. A refresh operation can be effected by energizing row drive lines (also called "word selecting lines"). When a certain row drive line is energized, the contents of all the memory cells connected therewith are read out and amplified by their associated sense amplifiers until they are written back. A column address is used for selecting the sense amplifier output to be sent to an output circuit. In the dynamic memory of this type, therefore, a refresh operation can be achieved not only by the normal read and write operations requiring both row and column addresses but also by the memory drive operation for which only the row address is designated. A refresh of the latter type will be called a "RAS only refresh", which has usually been used in the prior art.

One of the problems accompanying a refresh is the accumulation of data errors. Data read out by the RAS only refresh is written back as it is without passing through an error detect/correct circuit which is disposed outside of the memory. As a result, errors having appeared once in the sense amplifier output for various reasons are left uncorrected and are accumulated through repetitions of refreshing until they cannot be corrected in a normal read operation.

A prior art apparatus for detecting and correcting the errors in association with the refreshing is disclosed in Japanese Patent Laid-Open No. 55-101199 which is entitled "Memory Refresh Apparatus". In the disclosed apparatus, a refresh is effected by designating a column address in addition to a row address in each refresh cycle to perform a read operation (A refresh of this type will be called a "read refresh"), with the read-out data being passed to an error detect/correct circuit. If a correctable error is detected, a special write cycle is started immediately (i.e. independently of the regular refresh cycle) so that the corrected data is written back. This prevents errors from accumulating. However, execution of the normal read or write operation has to be postponed until the end of that special write cycle inserted for error correction.

Besides, when the aforementioned read refresh is to be applied to a large memory, several problems arise. A large memory has a hierarchical structure. For example, a memory array is constructed of a plurality of memory packages, each of which contains a plurality of memory element groups. The memory address contains the memory element group address and the memory package address in addition to the row and column addresses. The row and column addresses are sent to a particular memory element group designated by the other addresses to designate a location therein. One read refresh operation can thus refresh only one row in a single memory element group. A remarkably large number of refresh cycles are required for refreshing throughout a large-scale memory by the read refreshing of that type. This results in increase in the number of the refresh cycles per unit time and decrease in the time period available for the normal read and write operations. If the aforementioned disadvantages are to be avoided by executing read refresh operations simultaneously in all the memory element groups, a large quantity of hardware is required to select one word to be checked from the output data coming from all the memory element groups.

There are other problems to be considered:rechecking after the corrected data has been written back; and measures according to the result of the recheck, such as the transfer of data to a spare memory area or securing the consistency of data during a series of processings starting from an error detection.

SUMMARY OF THE INVENTION

One object of the present invention is to provide a mechanism for detecting and correcting errors associated with a periodic refresh without any delay in the execution of the normal read and write operations by making use of only the regular refresh cycle.

Another object of the present invention is to realize the error detection and correction making use of only the regular refresh cycle efficiently and without any substantial increase in the hardware even in a large-scale memory.

Still another object of the present invention is to use only the regular refresh cycle for rechecking after the corrected data has been written back and, if necessary, for data transfer to a spare memory area.

A further object of the present invention is to secure the consistency of data for the period of a series of processings which are started from the detection of an error and conducted by making use of only the regular refresh cycle.

In successive refresh cycles, according to the present invention, read refresh is usually conducted for successive addresses designated as the refresh addresses. The data thus read out is checked. If a correctable error is detected, the corrected data is held in a corrected data register, and at the same time the address associated with that error is held in an address register. There are provided a comparator for detecting the coincidence between the content of that address register and the memory address designated for the memory drive, and operation directing means for designating and starting the operation to be conducted in each refresh cycle, on the basis of the number of the coincidences detected in the refresh cycles by the comparator. This operation directing means usually directs the read refresh, but it directs the write operation for refresh when the first coincidence of the addresses is detected after the detection of a correctable error, so that the corrected data stored in the corrected data register is written back to the corresponding address (A refresh of this type will be called a "write refresh"). When the second address coincidence is subsequently detected, the data which has been written back is checked again through a read refresh. If an error is detected again, a data transfer sequence to the spare memory area is started. The consistency of data is secured throughout the process of these operations.

For a memory having plural memory element groups, the read refresh is conducted in the memory element group designated by the refresh address, whereas the RAS only refreshing is conducted for the corresponding rows in all the remaining memory element groups.

BRIEF DESCRIPTION OF THE DRAWINGS

FIGS. 5, 6, 7 and 8 are address transition charts for explaining the operations of the apparatus shown in FIG. 1.

DESCRIPTION OF THE PREFERRED EMBODIMENT

Figure 1:
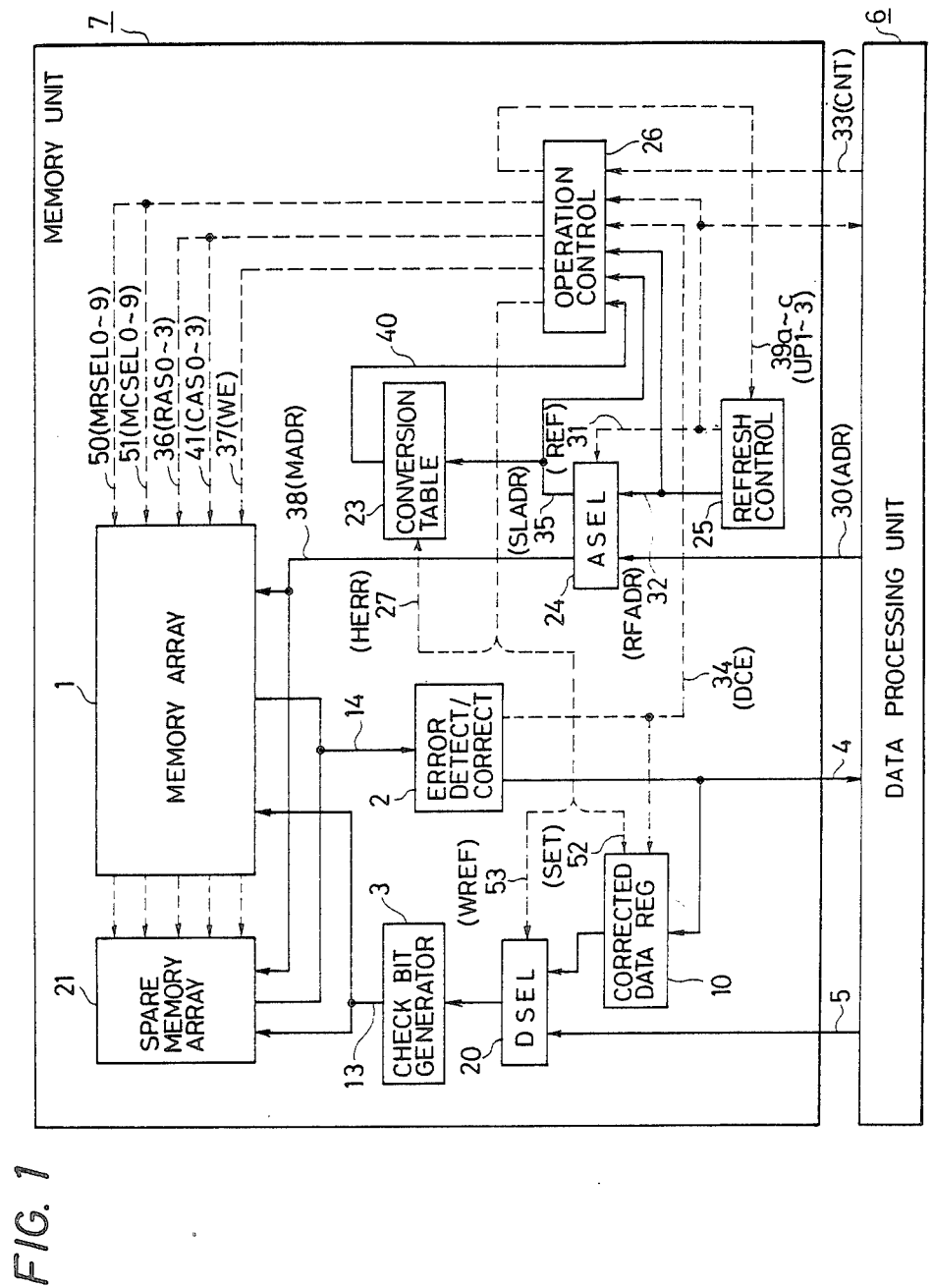
FIG. 1 is a block diagram schematically showing the overall structure of one preferred embodiment of the present invention.

FIG. 1 is a block diagram showing the overall structure of the preferred embodiment of the present invention. A data processing unit 6 designates either a normal read or write operation via a control signal (CNT) 33 and the address to be accessed via an address (ADR) 30 for a memory unit 7. The data processing unit 6 receives read-out data 4 in its reading operation and sends out data 5 to be written in its writing operation.

A memory array 1 is composed of eight sheets of memory packages (i.e. memory packages 0 to 7) each comprising four RAM groups, and a spare memory array 21 is composed of two sheets of memory packages (i.e. memory packages 8 and 9) each having the same structure as that of the memory array 1. When a hard error (which is a fixed or steady error mainly caused by damage of elements) occurs in a certain package of the memory array 1, this package is replaced by one of the memory packages of the spare memory array 21. For addressing of those memory arrays, the socalled "address multiplex system" is adopted. A refresh control circuit 25 has a timer for establishing a refresh cycle at a predetermined time interval to generate a refresh actuating signal (REF) 31 and a refresh address (RFADR) 32 and to increment the RFADR 32 by one in each refresh cycle. An operation control circuit 26 receives the CNT 33 and REF 31 to determine an operation mode (such as read, write, read refresh or write refresh mode), and receives the ADR 30 or the RFADR 32 as a select address 35 from an address selector 24 which will be described later to decode it so that it generates: RAS select signals (MRSELs 0 to 9) 50 and CAS select signals (MCSELs 0 to 9) 51 which are select signals for the memory package to be accessed; row address strobes (RASs 0 to 3) 36 and column address strobes (CASs 0 to 3) 41 corresponding to the four RAM groups in each package; and a write enable signal (WE) 37 shared among all the RAM groups, sending them to the memory array 1 and the spare memory array 21. The MRSELs 0 to 9 and the MCSELs 0 to 9 are the select signals for selectively feeding the RASs 0 to 3 and the CASs 0 to 3 to the corresponding one of the memory packages 0 to 9, and the replacement of a memory package in the memory array 1 by a memory package in the spare memory array 21 is effected by energizing one of the MRSELs 8 and 9 and the corresponding one of MCSELs 8 and 9 in place of one of the MRSELs 0 to 7 and the corresponding one of the MCSELs 0 to 7. The memory array 1, the spare memory array 21, the refresh control circuit 25 and the operation control circuit 26 will be described in more detail hereinafter.

The address selector (ASEL) 24 selects the ADR 30 or the RFADR 32, respectively, in the normal read or write operation and in the refresh operation to send it as the select address (SLADR) 35 to the operation control circuit 26 and a conversion table 23, and multiplexes the row address and the column address to send the same as a memory address (MADR) 38 to the memory array 1 and the spare memory array 21. In response to a hard error signal (HERR) 27, the conversion table 23 registers therein the SLADR 35 (or the hard error address) at that time and its replacing memory package number, and sends the replacing memory package number as feedback data 40 to the operation control circuit 26 if the memory package address in the SLADR 35 is coincident with the memory package address of the registered hard error address during the subsequent access operation. In response to the feedback data 40, the operation control circuit 26 energizes either pair of the MRSEL 8 and the MCSEL 8 or the MRSEL 9 and the MCSEL 9 on the basis of the data 40 to access the corresponding memory package in the spare memory array 21. In a normal read operation, an error detect/correct circuit 2 checks the presence of the error in the data read out from the memory array 1 or 21 to correct the data if a correctable error is found and otherwise to send the data as the read-out data 4 to the data processing unit 6 without correction. Also in the read refresh operation, the error detect/correct circuit 2 performs an error check similar to the aforementioned one to correct the data, if a correctable error is found out, and to send a correctable error detect signal (DCE) 34 to the operation control circuit 26 and the corrected data register 10 simultaneously with the correction. Otherwise, the error detect/correct circuit 2 neither sends the DCE 34 nor corrects the data. In this case, however, the data is abandoned. The corrected data register 10 latches the read-out data 4 as the corrected data when it receives the DCE 34, and receives a set signal (SET) 52, when a hard error is detected, to latch the data read out in the read refresh operation as the data to be transferred to the spare memory package. A data selector (DSEL) 20 receives the written-in data 5, in the normal writing operation, and takes in the data of the corrected data register 10 under the direction of a write refresh signal (WREF) 53, in the write refresh operation, to send them to a check bit generator 3. This check bit generator 3 adds error correcting bits to the data from the DSEL 20 to send them as memory array written-in data 13 to the memory arrays 1 and 21.

Figure 2A:
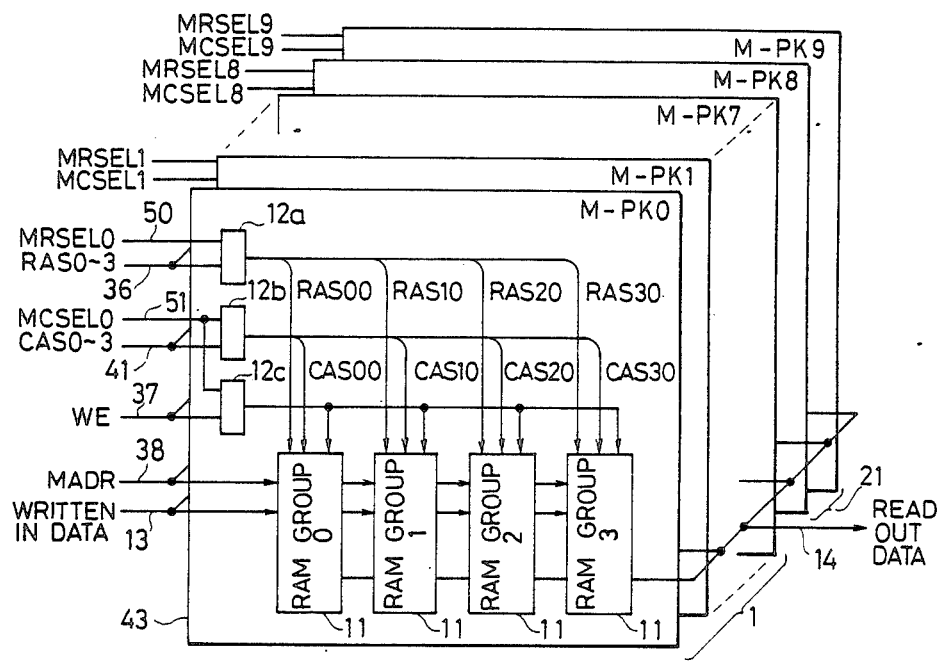
FIGS. 2A and 2B are block diagrams showing in more detail the memory array and the spare memory array shown in FIG. 1.
Figure 2B:
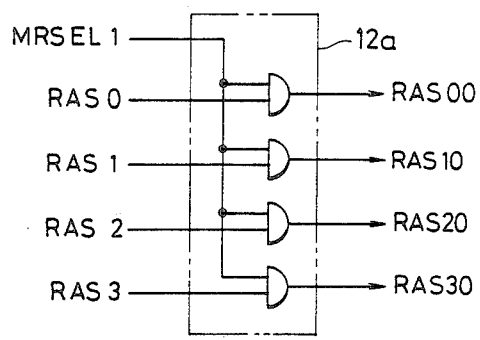

FIG. 2A shows the structures of the memory array 1 and the spare memory array 21 of FIG. 1. In this embodiment, each RAM group 11 is composed of 72 memory elements, each of which is a dynamic RAM of 256K bits having $2^9$ rows $\times 2^9$ columns and 256 refresh cycles/4 ms. Thus, each RAM group 11 has a structure for the 256K words having a word length of 72 bits. Moreover, the four RAM groups 0 to 3 construct together one memory package 43, and eight sheets of memory packages (M-PKs 0 to 7) construct together the memory array 1 whereas two sheets of memory packages (M-PKs 8 and 9) construct together the spare memory array 21. The MRSELs 0 to 9 and the MCSELs 0 to 9 are selectively fed to the corresponding memory packages M-PKs 0 to 9, and the RASs 0 to 3, the CASs 0 to 3, the WE, the MADR and the written-in data 13 are fed in parallel through their respective signal lines to those ten sheets of memory packages (M-PKs 0 to 9). The RASs 0 to 3, the CASs 0 to 3 and the WE are selected by gates 12a, 12b and 12c, respectively, and the MADR is received by a specific RAM group to which the RAS signal and the CAS signal are applied. In FIG. 2A, the gates 12a and 12b are shown in simplified forms, but FIG. 2B shows the detail of the gate 12a which is similar to the gate 12b. Read-out data 14 is prepared by logically OR-ing the outputs of the respective RAM groups and further by logically OR-ing the outputs of the respective packages.

For example, an explanation is made about the case in which the RAM group 1 of the M-PK 0 is accessed for various operations. First, in the reading operation, the operation control circuit 26 decodes the higher place bit group of the SLADR 35 and selects and energizes the MRSEL 0 and the MCSEL 0, and the RAS 1 and the CAS 1. In the meanwhile, the ASEL 24 of FIG. 1 multiplexes the row and column addresses or the lower place bit goups of the addresses, in time with the RAS 1 and the CAS 1, to send them as the MARDR 38. In the M-PK 0, the RAS 1 and CAS 1 are gated through the gates 12a and 12b by the MRSEL 0 and the MCSEL 0, and the RAS 10 and the CAS 10 are energized so that the data are read out from the address designated by the MADR 38 in the RAM group 1.

In the writing operation, the WE 37 is energized in addition to the selective drive similar to the aforementioned one. Simultaneously with this, the written-in data 13 is fed to and written in the location designated by the MADR 38 in the RAM group 1 of the M-PK 0.

In the case of the read refreshing operation, the operation control circuit 26 energizes the MRSELs 0 to 9, the MCSEL 0, the RASs 0 to 3, and the CAS 1. As a result, the RASs 0 to 3 but not the CASs 0 to 3 are fed to the RAM groups 0, 2 and 3 of the M-PK 0 and the RAM groups 0 to 3 of the M-PKs 1 to 9 so that the conventional RAS only refreshing (i.e., the refreshing by energizing only the row drive line ) is conducted for all the cells belonging to the designated row address in the MADR 38. In the RAM group 1 of the M-PK 0, on the other hand, both the RAS 10 and the CAS 10 are fed so that the read operation for the location specified by the designated row and column addresses in the MADR 38, i.e. the read refresh for that row is conducted to output the read-out data. In the case of write refresh operation, on the other hand, the selective drive similar to that for the read refresh operation is conducted, and the WE 37 is fed to all the RAM groups. Since, however, both the RAS 10 and the CAS 10 are energized only in the RAM group 1 of the M-PK 0, the write operation, i.e. the write refresh, is effected therein, but the RAS only refresh is effected in the remaining RAM groups.

Figure 3A:
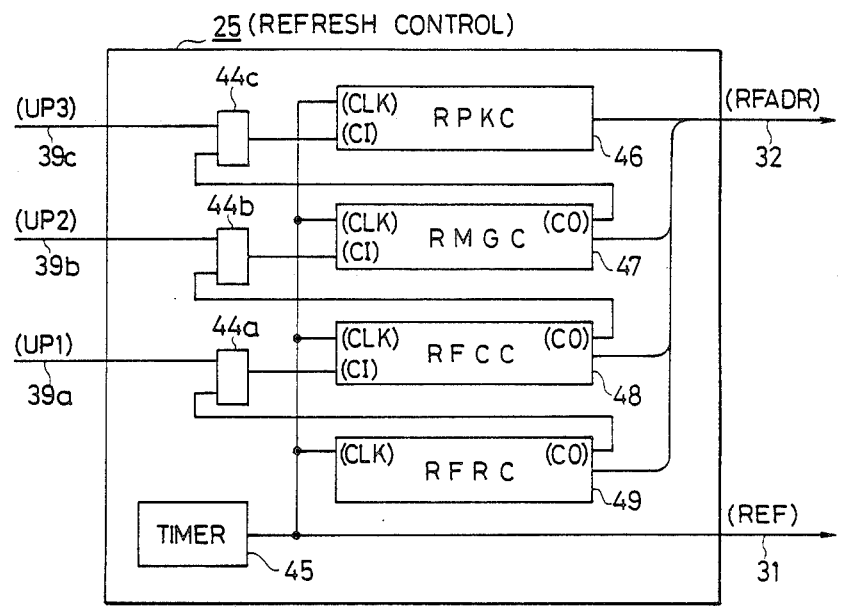
FIG. 3A is a block diagram showing in more detail the refresh control circuit shown in FIG. 1.

FIG. 3A shows the structure of the refresh control circuit 25 in FIG. 1. A timer 45 counts the refresh time intervals to generate the refresh actuate signals (REF) 31 at predetermined periods. The REF 31 is fed in common to the respective clock (CLK) terminals of a refresh row address counter (RFRC) 49, a refresh column address counter (RFCC) 48, a refresh RAM group address counter (RMGC) 47 and a refresh memory package address counter (RPKC) 46. The carry-out (CO) output of the RFRC is fed to the carry-in terminal (CI) of the RFCC through an AND gate 44a which receives an RFCC control signal (UP 1) 39a as the other input. Moreover, the CO output of the RFCC is fed to the CI terminal of the RMGC through a withhold circuit 44b which is controlled by an RMGC control signal (UP2) 39b, and the CO output of the RMGC is fed to the CI terminal of the RPKC through a withhold circuit 44c which is controlled by an RPKC control signal (UP3) 39c. The RFCC, RMGC and RPKC count up only when they are fed simultaneously with the CI input and the CLK input. The UP1 39a is normally in its energized state to feed the CO output of the RFRC to the CI terminal of the RFCC. Unless the UP1 39$\bar{a}$ is energized, the CI input of the RFCC is blocked so that the higher place counters subsequent to the RFCC have their count stopped, but only the RFRC continues to count. The withhold circuits 44b and 44c allow the CO output to pass therethrough if the UP2 39b and the UP3 39c are energized, but otherwise withhold the CO output until the same are energized. The UP2 39b and the UP3 39c are normally in their energized states. As will be detailed hereinafter, those irregular counting operations are necessary for fixing the column address and the higher level addresses or the RAM group address and the higher level addresses for a predetermined time period, in case a correctable error is detected in the read refresh operation so that the rewrite by the write refresh and the recheck by the subsequent read refresh are to be conducted, and in case it is judged as a result of the recheck that a hard error has occurred so that the data transfer to the spare memory array is to be conducted. The counted values of those counters are assembled to form the refresh address (RFADR) 32.

Figure 3B:
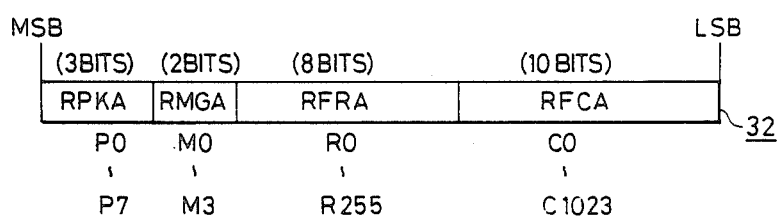
FIG. 3B is a format showing the refresh address.

FIG. 3B shows the format of the refresh address (RFADR) 32. The refresh row address (RFRA) is located in a lower place than the refresh column address (RFCA), as viewed from the structure of the refresh address counter in FIG. 3A, but in a higher place than the RFCA in the address format. Moreover, the memory element adopted in the present embodiment is the RAM of 256 ($=2^8$) K bits having $2^9$ rows $\times 2^9$ columns and 256 refresh cycles/4 ms. As to the refresh, more specifically, the memory elements are handled as if they had a structure of $2^8$ rows $\times 2^{10}$ columns. As a result, as shown in FIG. 3B, the refresh row address (RFRA) has 8 bits, and the refresh column address (RFCA) has 10 bits. For the read or write refresh, however, the memory elements have to be handled as those of the intrinsic structure of $2^9$ rows $\times 2^9$ columns, since each word has to be designated. As a result, each of the row and column addresses fed to the RAM groups has to be constructed of 9 bits. For this reason, the address for the read or write refresh is fed to the MADR 38 of FIG. 1 such that one bit of the RFCA is provided as the most significant bit of the RFRA. In order to discriminate the four RAM groups and the eight sheets of the memory packages, moreover, the refresh RAM group address (RMGA) and the refresh package address (RPKA) have two and three bits, respectively.

Figure 4:
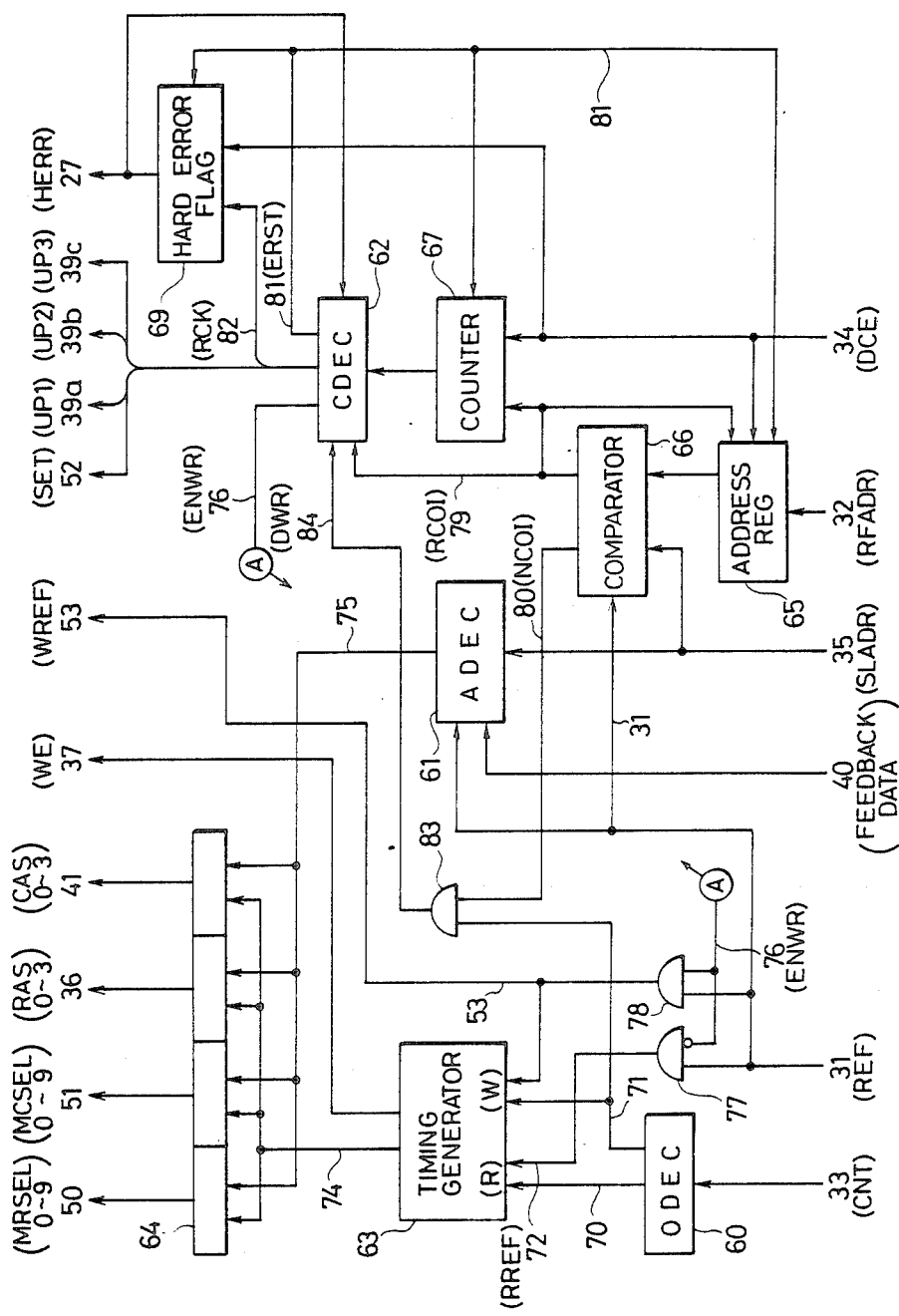
FIG. 4 is a block diagram showing in more detail the operation control circuit shown in FIG. 1.

FIG. 4 shows the structure of the operation control circuit 26 of FIG. 1. An operation decoder (ODEC) 60 decodes the CNT 33 from the data processing unit 6 to generate a read signal 70 or a write signal 71. An AND gate 77 allows the REF 31 to pass therethrough, when a write refresh enable signal (ENWR) 76 which will be described later is not energized, to generate a read refresh signal (RREF) 72. An AND gate 78 likewise generates a write refresh signal (WREF) 53 when the ENWR 76 is energized. A timing generator 63 generates a timing signal 74 in response to the read signal 70 or the write signal 71, and further immediately after the end of the cycle being executed in response to the RREF 72 or the WREF 53, and generates the WE 37 when the write signal 71 or the WREF 53 connected to an input terminal indicated at (W) in FIG. 4 is generated. An address decoder (ADEC) 61 receives the SLADR 35 from the ASEL 24, discriminates between the normal read/write access and the refresh access in dependence upon the absence and presence of the REF 31, and converts the designated package number to that of the replacing package in the spare memory array 21 according to the feedback data 40 from the conversion table 23 in case the feedback data 40 is supplied, so as to generate an address decode signal 75. This signal is timed by the timing signal 74 in a gate group 64 so that a predetermined combination of the MRSELs 0 to 9 (50), the MCSELs 0 to 9 (51), the RASs 0 to 3 (36) and the CASs 0 to 3 (41) is generated, as has been described with refrence to FIG. 2A.

In response to the DCE 34, an address register 65 latches the RFADR 32 when a correctable error occurs. During the data transfer to the spare memory array, moreover, the address register 65 designates the transfer address by incrementing its content by 1 at every other occurrence of an RCOI 79, and clears its content in response to an error reset signal (ERST) 81. A comparator 66 compares the content of the address register 65 and the SLADR 35 and judges whether or not a refresh operation is going on depending upon the REF 31 to generate the refresh coincidence signal 79 (RCOI) if the two addresses coincide during a refresh, and a normal access coincidence signal (NCOI) 80 if the coincidence takes place during the normal read or write access operation. A counter 67 is provided to count the recurrence number of the refresh row address after a correctable error occurs, and counts up in response to the RCOI 79 after it is initially incremented to the value "1" in response to the DCE 34. Its counted value corresponds to the operation state concerning the refresh. More specifically, the counted value "0" indicates that no error has occurred; the value "1" that a correctable error has occurred; the value "2" the write refresh operation for writing back the corrected data; the value "3" the read refresh operation for rechecking the corrected data after having been written back; the value "4" the write refresh operation for transferring the hard error data to the spare memory array; the value "5" the read refresh operation for reading out the subsequent transfer data; and the value "6" the write refresh operation for writing that transfer data in the spare memory array. Subsequently the counting-up operation is continued with the odd number counts indicating the read refresh operation while the even number counts indicate the write refresh, until the transfer sequence terminates.

A count decoder CDEC 62 decodes the counted value of the counter 67 to generate a variety of control signals in accordance with the combination of that counted value with other signals. If the counted value is "2", "4", "6" or a larger even number when the RCOI 79 is generated, the count decoder CDEC 62 energizes the write refresh enable signal (ENWR) 76 to execute a write refresh operation. The UP1 39a is energized, when the counted value is "0", "4" or a larger even number, to cause the RFCC to count up in response to the carry-out (CO) output of the RFRC of FIG. 3A thereby incrementing the RFCA in the refresh addresses by 1. When the counted value is "1", "2", "3", "5" or an odd number larger than "5", the UP1 39a is de-energized to suppress the aforementioned incrementing. The UP2 39b and the UP3 39c are normally energized, but will be de-energized during the data transfer period when the counted value is "4" or greater. However, the former and the latter are temporarily energized at the end of the transfer of the whole contents of one RAM group and one package, respectively, to count up the RMGC and the RPKC of FIG. 3A, respectively. If no hard error signal (HERR) 27 is generated at the counted value "3", the CDEC 62 judges that no error has been detected by the second read check so that the preceding error is a soft error (i.e. a temporary error caused by radioactive rays or the like), and generates the error reset signal (ERST) 81 to reset the address register 65 and the counter 67 thereby to restore the operation to the normal read refresh sequence. If the HERR 27 is generated at the counted value "3", on the other hand, the CDEC 62 judges that a hard error is present, continues the counting operation without generating the ERST 81, and generates this ERST 81 after the final data transfer to the spare memory array 21 to restore the operation to the normal read refresh sequence. The set signal (SET) 52 is energized by the RCOI 79, when the counted value proceeds to an odd number equal to or larger than "5", to set the data which is read out by the read refresh operation (i.e. the data to be transferred to the spare memory array 21) in the corrected data register 10. Moreover, a second read check signal (RCK) 82 is generated by the RCOI 79 when the counted value proceeds to "3". A hard error flag 69 is set when the RCK 82 and the DCE 34 are generated, and is reset in response to the ERST 81.

In order to detect both the normal write operation in the error address before the rewrite by the write refresh operation and the normal write operation to a transfer destination address in the spare memory array 21 prior to the transfer to the same address, an AND gate 83 detects the coincident occurrence of the NCOI 80 and the write signal 71, and generates a write refresh inhibit signal (DWR) 84. In response to this DWR 84, the CDEC 62 interrupts energization of the ENWR 76 and switches the AND gates 77 and 78 to replace the write refresh operation for said address with the read refresh operation thereby to secure the consistency of memory contents described later.

Figure 5:
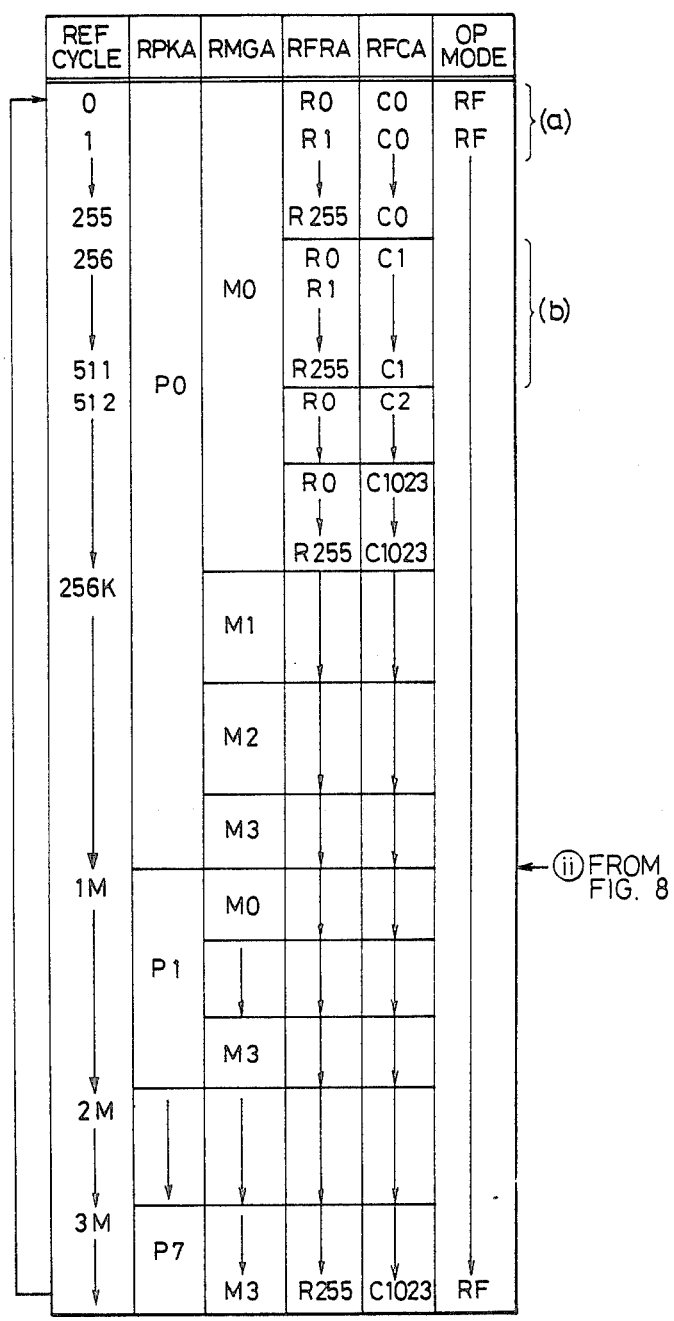

FIGS. 5 to 8 show several examples of the operations of the aforementioned embodiment in terms of the transitions of the address designated by the refresh address counter of FIG. 3A. FIG. 5 shows the case where no error is detected in the data read out by the read refresh. The left end column "REF CYCLE" contains the refresh cycle numbers for discriminating the respective refresh cycles. The meanings of the respective symbols RPKA, RMGA, RFRA and RFCA are the same as those of FIG. 3B, and their columns indicate that their address values progress in the orders of P0 to P7, M0 to M3, R0 to R255, and C0 to C1023, respectively. The operation modes of the respective refresh cycles are indicated at the left end column "OP MODE", in which symbols RF, WF and R/W indicate a read refreshing mode, a write refreshing mode, and a normal read or write mode, respectively. The names of these columns are omitted from FIGS. 6 to 8.

In the cycle No. 0, as shown on the first row of FIG. 5, the read refresh operation is executed for the address

[R0, C0] of the RAM group M0 in the M-PK 0. Here, the operations of the respective portions of FIG. 1 in the cycle No. 0 will be described. In the memory elements used in the present embodiment, as has been described hereinbefore, the distributed refreshing of 256 refresh cycles/4 ms should be conducted so that the refresh control circuit 25 sends the REF 31 and the RFADR 32 to the operation control circuit 26 and the RFADR 32 to the ASEL 24 at intervals of about 15 $\mu$s. The operation control circuit 26 responds to the REF 31 to energize automatically the MRSELs 0 to 7 and the RASs 0 to 3 and to energize the MCSEL 0 and the CAS 0 according to the PO and MO of the refresh address sent as the SLADR 35 from the ASEL 24. This ASEL 24 multiplexes the R0 and C0 of the refresh address as the row and column addresses, respectively, to send them as the MADR 38. As a result, as has been described with reference to FIG. 2A, the data of the address [R0, C0] are read from the RAM group 0 in the M-PK 0 by the read refreshing, and the RAS only refreshing is conducted for the rows R0 of the RAM groups 1 to 3 in the M-PK 0 and all the RAM groups in the M-PKs 1 to 7. The read-out data from the address [R0, C0] of the RAM group 0 in the M-PK 0 is checked as the memory array read-out data 14 by the error detect/correct circuit 2 and is abandoned in case of no error after the completion of the check, thus terminating the cycle No. 0.

Figure 8:
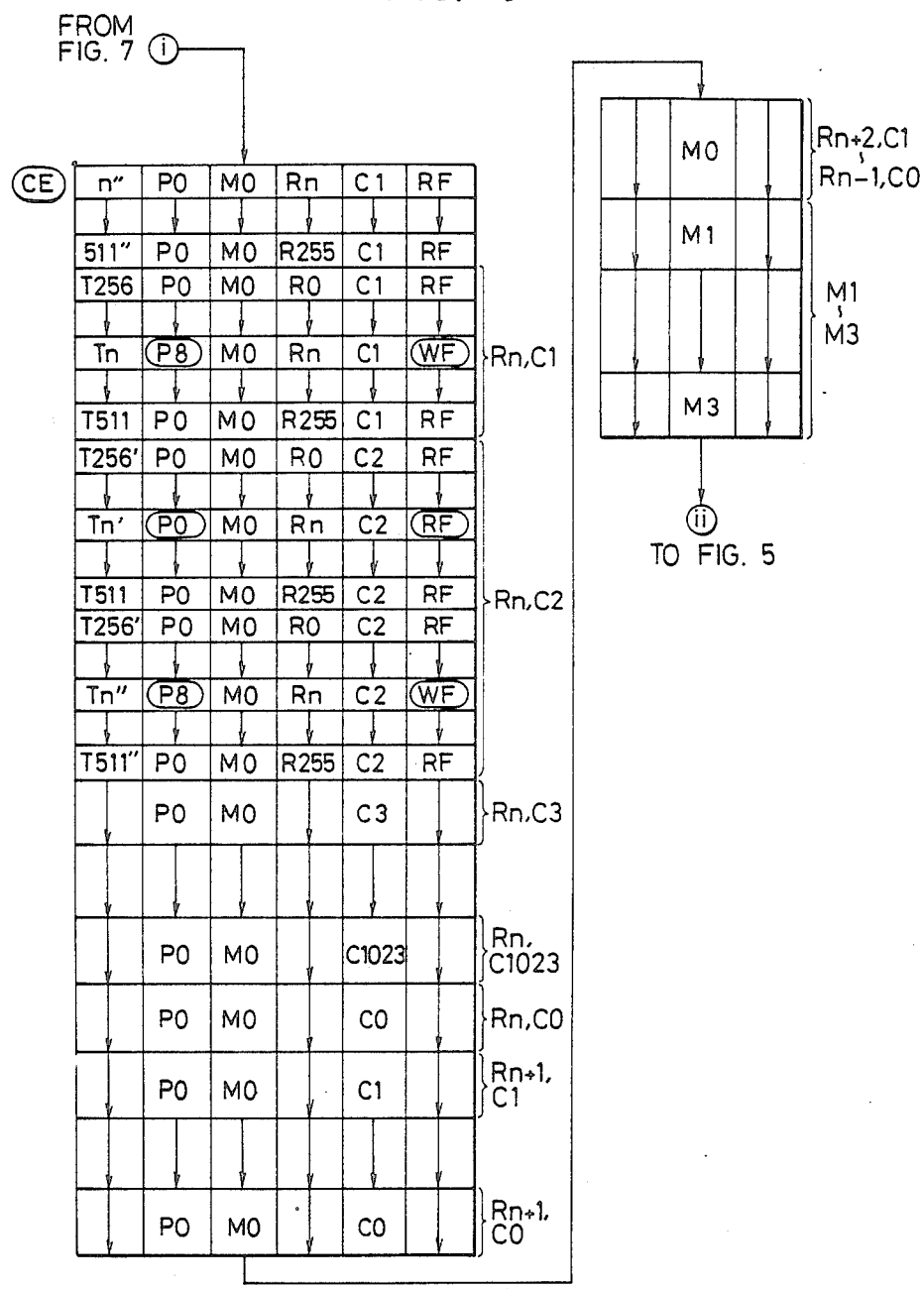

It is after about 15 $\mu$s, as has been described hereinbefore, that the read refresh operation of the cycle No. 1 is conducted after the cycle No. 0, and normal read or write operations are conducted in this interval. To clarify this, FIG. 6 shows a portion (a) of FIG. 5 on an enlarged scale. The symbol R/W appearing in the column "OP MODE" at the right end indicates the execution of a normal read or write cycle. Likewise, the respective subsequent read refresh cycles are caused at intervals of about 15 $\mu$s, and the normal read or write operations are conducted during the intervals. Only the read refresh cycles in a series of such operations are shown in FIGS. 5, 7 and 8.

In the cycle No. 1, the RFRA is incremented by 1 so that the data of the address [R1, C0] in the RAM group 0 in the M-PK 0 is checked like the preceding refresh cycle. At the same time, the RAS only refreshing of the row R1 is conducted in all the remaining RAM groups. When the cycle No. 255 is finished likewise, the RFRA has progressed from R0 to R255. Thus, a round of refreshing sequence throughout all the rows is completed, and the check of the data of the addresses [R0 to R255, C0] finishes. In the cycle No. 256, the C0 output of the RFRC in FIG. 3A advances the RFCC so that the column address (RFCA) steps to C1. During a second round of the refreshing sequence up to the cycle No. 511, the data of the addresses [R0 to R255, C1] are then checked. Subsequently, the column address is successively incremented so that the check of the data up to C1,023 finishes. Thus, the check of the RAM group 0 in the M-PK 0 is completed. Then, the C0 output of the RFCC in FIG. 3A advances the RMGC so that the RAM group address RMGA is incremented from M0 to M1, thus starting the check of the RAM group 1. Subsequently, the check of the data finishes up to M3 so that the package address RPKA proceeds from P0 to P1 to effect the check of the M-PK 1. In like manner the data up to the address [P7, M3, R255, C1,023] is successively checked. Then, the check of the data of all the addresses of the memory array 1 has finished so that the operation is returned to the cycle No. 0.

FIG. 7 shows the flow when the error detect/correct circuit 2 detects a correctable error (as indicated by symbol ⓒⒺ outside of the left column) during the read refresh operation of the cycle No. n in a section (b) of FIG. 5. On this occasion, the error detect/correct circuit 2 sends the correctable error detect signal (DCE) 34 to the operation control circuit 26 and corrects the erroneous data to store the corrected data in the corrected data register 10. The operation control circuit 26 responds to the DCE 34 to store the fact of the occurrence of the correctable error and to record the refresh address RFADR 32 in which said error is discovered (which will be called the 37 error RFADR",[P0,M0,Rn,C1] in this example) in the address register 65 (as shown in FIG. 4), and interrupts the energization of the RFCC control signal UP1 39$a$ to continue the read refreshing. In the cycle No. 256' (or the cycle No. 512 in the normal state), the C0 output of the RFRC of FIG. 3A is generated, but the RFCC does not count up, because the UPI 39$a$ is not energized, so that the row address RFCA remains at C1.

The operation control circuit 26 continues the read refresh while comparing by means of the comparator 66 the error RFADR recorded in the address register 65 of FIG. 4 and the SLADR 35 in each refresh cycle. If the operation control circuit 26 detects the first coincidence, i.e. the coincidence in the cycle No. n'just one round after the occurrence of the aforementioned correctable error, it energizes the write enable (WE) 37 to effect a write refresh operation and sends the corrected data stored in the corrected data register 10 of FIG. 1 through the DSEL 20 to the check bit generator 3, in which the error correcting bits are added, and subsequently write back the corrected data in the address [Rn, C1] of the RAM group 0 of the M-PK 0 (as shown at ⓌⒻ in FIG. 7). Then, the operation control circuit 26 reopens the read refresh and checks the previously written-back data upon the next address coincidence, i.e. in the read refresh operation one round after the aforementioned write-back. If no error is detected, the operation control circuit 26 judges that the preceding error is a soft error so as to energize the UP1 39$a$ again and to reset the address register 65 of FIG. 4, restoring the operation to the normal read refresh sequence. The cycle No. n" of FIG. 7 is the cycle for the aforementioned recheck, and symbol ⓒⒺ appearing outside of the left column indicates that no error is detected. As the RFRA has reached R255 and returns to R0, i.e. in the cycle No. 512, the RFCA proceeds from C1 to C2 and the flow of FIG. 5 is resumed.

FIG. 8 shows a flow for another example which branches from ⓘ of FIG. 7. This flow is different from that of FIG. 7 firstly in that a correctable error is again detected in the cycle No. n". On this occasion, the operation control circuit 26 judges that a hard error has occurred, and sets the hard error flag 69 of FIG. 4 to generate HERR 27 thereby to register in the conversion table 23 the error RFADR in the address register 65 as the hard error address and the number of an unused package in the spare memory array 21 which is selected as the replacing memory package, for example the number of M-PK 8. On the other hand, the corrected data is stored in the corrected data register 10 and the UP1 39$a$ is held de-energized. As a result, the fact that the cycle No. 511" terminates so that the RFRA returns from R255 to R0, the RFCA is kept at C1, and a series of refreshing cycles for the transfer to the replacing package are started in the cycle T256. Subsequently, the read refreshing is successively conducted for R0 to Rn-1, and the comparator 66 detects in the cycle Tn again the coincidence between the content of the address register 65 and the refresh address (SLADR) 35 so that the CDEC 62 energizes the ENWR 76 to designate the write refresh operation by the WREF 53. At this time, the conversion table 23 detects the coincidence between the hard error address registered therein and the refresh address (SLADR) 35, and informs the operation control circuit 26 by the feedback data 40 of the fact that the M-PK 8 in place of the M-PK 0 is to be accessed. In response to this information, the operation control circuit 26 makes the ADEC 61 of FIG. 4 convert the package address RPKA from P0 to P8 to write the data from the corrected data register 10 in the corresponding row and column address [Rn, C1] in the corresponding RAM group (M0) in the replacing memory package M-PK 8, and makes the CDEC 62 energize the UP1 39a to effect the advance from C1 to C2 upon the first change from R255 to R0. In other words, the cycles No. T256 to No. T511 are a series of refreshing cycles for writing the data of the address [Rn, C1] in the spare memory array 21, as indicated outside of the right column of the drawing. After the aforementioned write refresh operation, the operation control circuit 26 increments the content of the address register 65 by 1 to prepare for the next round of operations.

Subsequently in successive refresh cycles up to the address [Rn, C0], the RFCA advances successively to C2, C3, and so on after every second round of 256 refresh cycles so that the read refresh operation for the address [Rn, Ci] (i=2, 3, - - - , 1,023, and 0) in the first round reads out the data from the M-PK 0 to set them in the corrected data register 10 and the read refresh operation in the second round for the address [Rn, Ci] is replaced by the write refresh operation to transfer the content of the corrected data register 10 to the M-PK 8. In FIG. 8, the cycle No. Tn' is the first round read refreshing cycle for the address [Rn, C2], and the cycle No. Tn" is the second round write refresh cycle for the same.

Meanwhile, the UP1 39a is deenergized when the first round read refresh operation finishes, and is energized again when the second round write refresh operation finishes, thus causing the RFCA to advance step by step after every two rounds. The address of the data to be transferred to the spare memory array 21 is held in the conversion table 23. Its value is at first the hard error address, but keeps track of the address of data to be transferred next by incrementing its RFCA portion by 1 upon each write refresh operation for the transfer to the spare memory array 21. When that value coincides with the SLADR 35, the replacing package number is sent to the operation control circuit 26.

When the transfers for the addresses up to [Rn, C0] are finished, as has been described hereinbefore, then the transfer for the address [Rn+1, Ci] (i=1,2 - - - , 1,023, and 0) is conducted. In like manner, the transfers for the addresses up to [Rn-1, Ci] are conducted through the address [R0, Ci]. During those transfers, the RMGC control signal UP2 39b of FIG. 3A is not energized so that the count up of the RMGC with the CO output of the RFCC is suppressed. When the transfer for the address [Rn-1, C0] is finished, the whole content of the RAM group 0 has been transferred to the RAM group 0 of the M-PK 8, whereupon the UP2 39b is temporarily energized to cause the RMGC to count up, so that the RMGA becomes M1.

Subsequently, the data transfers for M1, M2, and M3 are successively executed, and the transfers for all the data from the M-PK 0 to the M-PK 8 are completed at the point (ii) to return to the point (ii) of FIG. 5 so that the read refresh sequence for the M-PK 1 is started. At this time, a replace flag in the conversion table 23 is set, thereby replacing all the subsequent accesses to the M-PK 0 with those to the M-PK 8.

Here, the security of the consistency of data during the write-back period and the period of the data transfer to the spare memory array will be described in the following. First, in the flow of FIG. 7, in case a normal write access is requested for the error address prior to the cycle No. n', the operation control circuit 26 of FIG. 1 executes that normal write access and cancels the records of the occurrence of the correctable error and of the items associated therewith (containing the content of the address register 65). The operation control circuit 26 energizes the UP1 39a to restore the prior state. In order to prevent the data in the corrected data register, which has already become old, from being written in, the write refresh operation scheduled for the cycle No. n' is replaced by a read refresh operation. By energizing the UP1 39a, moreover, C1 is incremented to C2 in the cycle No. 256 so that the read refresh operation for the same address as that in the cycle No. 512 of FIG. 5 is conducted to restore the operation to the normal flow of FIG. 5.

In case a normal write access is requested for the error address between the cycle No. n' and the cycle No. n", the operation control circuit 26 executes that write access and cancels the records of the occurrence of the correctable error and of the associated items until it energizes the UP1 39a to resume its prior state. The result is that, in the cycle No. n", a read refresh operation not for the recheck but for the first check of the new data is conducted like the cycle No. n of FIG. 7. Therefore, the normal read refresh sequence is restored so long as no error is detected. If, on the other hand, a correctable error is detected also in the new data, the procedures subsequent to the cycle No. n of FIG. 7 take place again.

If a normal write access is requested for the error address after the flow of FIG. 8 has been entered and before the cycle No. Tn, the operation control circuit 26 executes the requested write operation for both the M-PK 0 and M-PK 8, and replaces the write refresh operation in the cycle No. Tn by a read refresh operation. In this case, however, it has already been found that a hard error occurs in the M-PK 0 so that the subsequent flow in FIG. 8 is continued as it is. When a normal write access to the M-PK 0 is requested subsequent to the period [Rn,C2] in FIG. 8, the write operation for the M-PK 8 is also conducted in a similar manner. In case the address of the transferred data and the write request address coincide, the write refresh operation for this address (as in the cycle No. Tn") is replaced by a read refresh operation to secure the consistency of data during the package replacing process.

The present invention should not be limited to the embodiment thus far described but can be applied to not only a smaller scale memory (which contains only one RAM group, for example,) but also a larger scale memory (which contains a plurality of groups of memory arrays and spare memory arrays, for example). Moreover, the replacement in the case of occurrence of the hard error may be conducted not only by the package but also by the RAM group or the row address.

As has been apparent from the description thus far made, according to the present invention, the error detection and the succeeding necessary processing are all executed in regular refresh cycles. This raises no undue delay in the execution of normal read and write operations. Simultaneously with the read refresh in the memory element group designated by the refresh address, moreover, the RAS only refresh of all the remaining memory element groups is conducted. As a result, even a large-scale memory is freed from any reduction in efficiency and any increase in required hardware, which might otherwise be caused by adopting the read refresh.

What is claimed is:

1. A diagnosis and error correction apparatus for a dynamic memory which has a plurality of locations identified by respective addresses and which requires periodic refresh operations to prevent its stored data from gradually degenerating, comprising:
    an error detect/correct circuit connected to receive data read out of said memory for detecting errors and correcting correctable errors in said data;
    a data register operatively connected to said error detect/correct circuit for storing output data from said error detect/correct circuit;
    a refresh control circuit including refresh signal generating means for generating refresh actuating signals at predetermined intervals, and refresh address generating means responsive to said refresh actuating signals for generating in synchronism with said refresh actuating signals successive memory addresses as refresh addresses which are sent to said memory to address the locations of said memory for refreshing; and
    an operation control circuit connected to said error detect/correct circuit, said data register and said refresh circuit, and including:
        (a) control signal generating means for generating control signals to be supplied to said memory for controlling memory operations,
        (b) an address register operatively connected to said refresh address generating means and said error detect/correct circuit for storing the refresh address generated by said refresh address generating means at the time when a correctable error is detected by said error detect/correct circuit during refreshing of said memory,
        (c) comparator means for comparing the content of said address register with said successive refresh addresses generated by said refresh address generating means to detect a coincidence between the content of said address register and any one of said refresh addresses,
        (d) a coincidence counter operatively connected to said comparator means for counting the number of times coincidence is detected by said comparator means during refreshing of said memory, and
        (e) refresh operation directing means operatively connected to said refresh signal generating means, said comparator means, said coincidence counter and said control signal generating means for controlling the refresh operation of said memory in response to each of said refresh actuating signals by actuating a read operation of said memory while no coincidence is detected by said comparator means and by actuating a write operation for writing the content of said data register into said memory when a first coincidence is detected by said comparator means as indicated by said coincidence counter.

2. A diagnosis and error correction apparatus according to claim 1, wherein a memory address includes a row address and a column address, said address generating means includes a first counter connected to said refresh signal generating means for generating successive row addresses and a second counter connected in tandem to said first counter for generating successive column addresses, and said refresh operation directing means is responsive to said error detect/correct circuit for suppressing the counting up of said second counter when a correctable error is detected by said error detect/correct circuit during refreshing of said memory.

3. A diagnosis and error correction apparatus according to claim 2, wherein said refresh operation directing means includes means for resetting said coincidence counter and said address register when said error detect/correct circuit detects no error upon detection of a second coincidence by said comparator means.

4. A diagnosis and error correction apparatus according to claim 3, wherein said comparator means includes means for comparing the content of said address register with addressess for memory accesses to detect a coincidence between the content of said address register and any one of said addresses for memory accesses, and said refresh operation directing means includes means for resetting said coincidence counter and said address register when a coincidence between the content of said address register and one of said addresses for memory accesses is detected by said comparator means prior to the detection of said second coincidence.

5. A diagnosis and error correction apparatus for a dynamic memory which has a plurality of location identified by respective addresses and which requires periodic refresh operations to prevent its stored data from gradually degenerating, comprising:
    an error detect/correct circuit connected to receive data read out of said memory for detecting errors and correcting correctable errors in said data;
    a data register operatively connected to said error detect/correct circuit for storing output data from said error detect/correct circuit;
    a refresh control circuit including refresh signal generating means for generating refresh actuating signals at predetermined intervals, and refresh address generating means responsive to said refresh actuating signals for generating in synchronism with said refresh actuating signals successive memory addresses as refresh addresses which are sent to said memory to address the locations of said memory for refreshing; and
    an operation control circuit connected to said error detect/correct circuit, said data register and said refresh circuit, and including:
        (a) control signal generating means for generating control signals to be supplied to said memory for controlling memory operation,
        (b) an address register operatively connected to said refresh address generating means and said error detect/correct circuit for storing the refresh address generated by said refresh address generating means at the time when a correctable error is detected by said error detect/correct circuit during refreshing of said memory, (c) comparator means for comparing the content of said address register with said successive refresh addresses generated by said refresh address generating means to detect a coincidence between the content of said address register and any one of said refresh addresses, (d) a coincidence counter operatively connected to said comparator means for counting the number of times coincidence is detected by said comparator means during refreshing of said memory, and (e) refresh operation directing means operatively connected to said refresh signal generating means, said comparator means, said error detect/correct circuit, said coincidence counter and said control signal generating means for initiating a memory area replacing sequence during the refresh operations by replacing a memory area in which an error has occurred with a spare memory area when said error detect/correct circuit detects a second error by detection of a second coincidence by said comparator means;

an address conversion table for converting address information designating a replaced memory area into address information designating its replacing spare memory area and for sending the latter to said control signal generating means; and wherein said operation control circuit further includes means operatively connected to said refresh operation directing means for loading said conversion table with (1) the address of a memory area including a location in which the error was detected upon detection of said second coincidence and (2) the address of said spare memory area at the start of said memory area replacing sequence.

6. A diagnosis and error correction apparatus according to claim 5, wherein said refresh operation directing means is, during said memory area replacing sequence, responsive to the detection of a first coincidence by said comparator means for actuating a read operation of said memory, and further responsive to the detection of a second coincidence by said comparator means for actuating a write operation for writing data read out upon detection of said first coincidence into said memory and for incrementing the content of said address register, said write operation being effected in said spare memory area which is designated by the address information from said address conversion table.

7. A diagnosis and error correction apparatus according to claim 6, wherein said comparator means includes means for comparing the content of said address register with addresses for memory accesses address generating means to detect a coincidence between the content of said address register and any one of said addresses for memory accessess, and said refresh operation directing means includes means responsive, during said memory area replacing sequence, to a write request directed to an address equal to the content of said address register which is generated between said first coincidence and said second coincidence for actuating write operation at the corresponding addressess in both said replaced memory area and said replacing memory area and for changing the write operation scheduled to be actuated upon detection of said second coincidence into a read operation.

* * * * *